United States Patent [19]

Fox et al.

[11] 4,012,579
[45] Mar. 15, 1977

[54] ENCAPSULATED MICROCIRCUIT PACKAGE AND METHOD FOR ASSEMBLY THEREOF

[75] Inventors: Donald J. Fox, Wauwatosa; Thomas M. Schuster, Waukesha, both of Wis.

[73] Assignee: Allen-Bradley Company, Milwaukee, Wis.

[22] Filed: Feb. 21, 1975

[21] Appl. No.: 551,762

[52] U.S. Cl. ............................ 174/52 PE; 29/627; 174/52 FP
[51] Int. Cl.² ........................................ H05K 5/00
[58] Field of Search .......... 174/52 PE, 52 S, 52 FP; 317/101 C, 101 CC, 101 CP; 357/74, 72; 29/588, 627

[56] References Cited
UNITED STATES PATENTS

| | | | |
|---|---|---|---|
| 3,265,806 | 8/1966 | Burks et al. | 174/52 FP |
| 3,354,394 | 11/1967 | James | 339/17 CF X |
| 3,370,203 | 2/1968 | Kravitz et al. | 339/17 CF X |
| 3,469,684 | 9/1969 | Keady et al. | 174/52 FP X |
| 3,668,299 | 6/1972 | McNeal | 174/52 FP X |

Primary Examiner—J. V. Truhe
Assistant Examiner—D. A. Tone
Attorney, Agent, or Firm—Quarles & Brady

[57] ABSTRACT

A microcircuit deposited on a substrate is encapsulated within a housing having bottom and top cover portions. The substrate initially is adhesively secured to the bottom cover portion. The bottom and top cover portions then are placed into engagement, the assembled housing containing the substrate is cured, and a potting compound is injected into, and allowed to solidify between, the cover portions to encapsulate the microcircuit.

15 Claims, 7 Drawing Figures

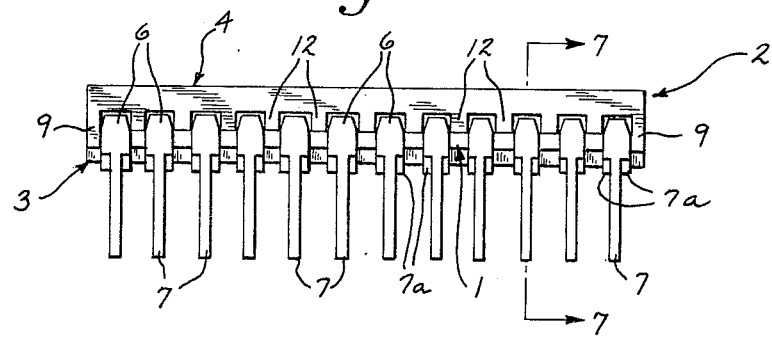
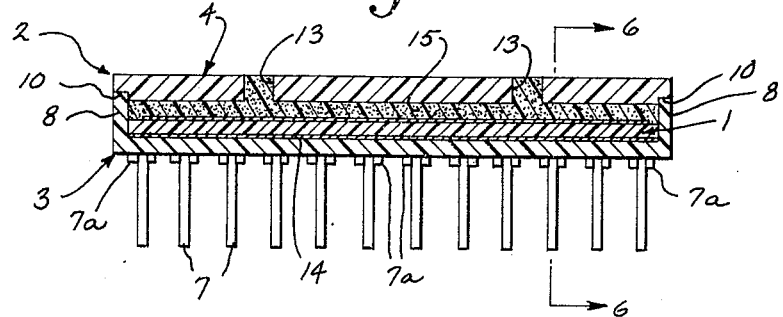
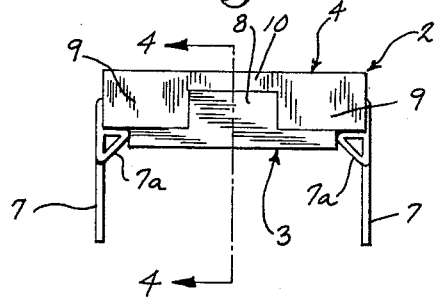
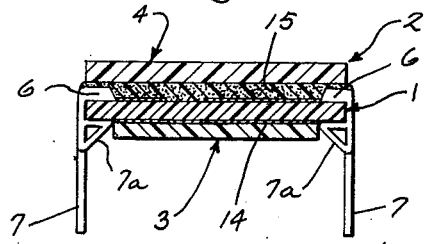
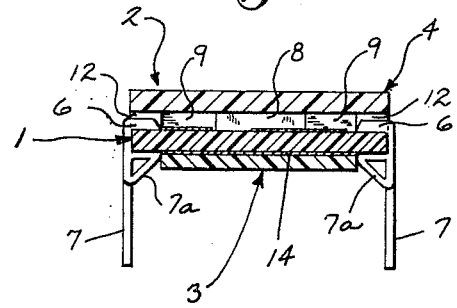

4,012,579

ENCAPSULATED MICROCIRCUIT PACKAGE AND METHOD FOR ASSEMBLY THEREOF

BACKGROUND OF THE INVENTION

This invention relates to microcircuit packages, and, more particularly, to a microcircuit encapsulated within a housing and a method for effecting the encapsulation.

There are presently many different types of microcircuit packages, and a variety of methods for assembling the package about the microcircuit. Glass to metal seal packages, glass-ceramic-metal packages, ceramic to metal packages, and plastic packages are among the most prevalent. The latter technology is primarily used for producing two types of packages. The first type is a premolded package with leads that can be sealed by either gluing or soldering a lid on the package. The second type includes a design in which plastic is formed about a microcircuit by casting or transfer molding. There are disadvantages, however, with both types of plastic packaging. A primary drawback with the soldered or glued package is its general non-hermeticity and lack of mechanical strength. Some of the major difficulties associated with the plastic transfer molded package relate to manufacturing and testing problems.

The metal leads in the soldered or glued package are commonly encased within a small glass coating along at least one side of the package. The leads are typically inserted sidewardly into the package and then bent over an edge. Thus, this assembly can be subjected to rather severe mechanical stress.

In the manufacture of plastic transfer molded packages, molding voids frequently result. Also, molding imperfections — such as flashes — are commonly incurred. Since, according to this technique, the plastic package is formed about the microcircuit, if the package must be discarded due to voids or imperfections caused by molding operations, then an otherwise adequate microcircuit becomes wasted. The microcircuit is the most expensive component in a packaged assembly, and the abandonment of a package containing a microcircuit which tests satisfactorily is a needless expense that adds to overall production costs.

If, on the other hand, the package defects or deficiencies are not sufficiently serious to warrant rejection, but are correctable, then labor costs must be incurred in rectifying the package so that the assembly will merit customer approval. Thus, these labor costs accrue when the cost of cleaning the package — such as filling voids or removing flashes — is less than the cost of rejection of the entire assembly including the microcircuit. Therefore, even minor package defects can lead to increased overall production costs in the form of labor costs.

Hence, package defects, resulting from molding operations, cause an increase in production cost — either capital or labor. This is particularly disadvantageous in the field of microcircuit packaging in that one of the most important features in this field is low cost.

Furthermore, since, according to this method, the plastic package is formed about the microcircuit, the fragile microcircuit components are exposed to molding temperatures and pressures which may have deleterious effects on these components.

SUMMARY OF THE INVENTION

The present invention contemplates a microcircuit encapsulated within a two-part housing, and more specifically, the invention resides in an encapsulated microcircuit including a housing having bottom and top cover portions, one of the cover portions having a projecting member thereon and the other cover portion having a recess therein which mates with the projecting member; a substrate having a microcircuit thereon and a plurality of terminals disposed on a side thereof, means for bonding the substrate to the upper surface of the bottom cover portion; and a compound which is disposed between the top and bottom cover portions and encapsulates the microcircuit therebetween.

The present invention also contemplates a method for encapsulating a microcircuit within a housing having bottom and top cover portions, and which more specifically includes bonding a substrate having a microcircuit thereon to the bottom cover portion of the housing, mating the top cover portion of the housing in engagement with the bottom cover portion thereby assembling the housing so that the underside of the top cover portion faces the microcircuit on the substrate, curing the assembled housing containing the substrate, injecting a compound through the top cover so that it flows between the top and bottom cover portions and allowing the compound to solidify whereby the microcircuit becomes encapsulated between the top and bottom cover portions.

It is an object of the invention to provide an encapsulated microcircuit that is easily assembled. A microcircuit is encapsulated within a two-part housing that includes a top cover portion which mates with a bottom cover portion. The bottom cover portion has an upstanding member integrally molded on one end. The upstanding member mates with a recess formed in one of the ends of the top cover portion. The cover portions of the housing are attached after a substrate containing a microcircuit is bonded to the bottom cover portion. A "potting" compound then is injected into the assembled housing to fill the space between the top and bottom cover portions.

It is another object of the invention to diminish the rejection of microcircuits due to package imperfections. The top and bottom cover portions of the housing are each molded in an operation separate from the manufacture of the substrate with its associated microcircuit. Thus, if there are any defects or deficiencies in the package components that are sufficiently serious to warrant rejection, these structural components can be discarded prior to encapsulation of a microcircuit. A deficient package should be refined only if the incident labor cost will not exceed the capital cost of packaging materials. Similarly, since the microcircuit is tested prior to its encapsulation within the housing, a microcircuit rejection will not also result in packaging waste as is the case in transfer molded packages.

It is a further object of the invention to encapsulate a microcircuit within a housing without exposing the microcircuit components to molding temperatures and pressures. Since the housing cover portions are molded in an operation separate from the microcircuit manufacture, the microcircuit components do not come in contact with molding temperature and pressure conditions.

It is yet another object of the invention to encapsulate a microcircuit within a housing without subjecting the assembled package to a significant amount of mechanical stress. A plurality of leads are bonded to terminals disposed on the substrate containing the microcircuit prior to placement of the substrate into the housing. The leads are attached to the substrate so that they extend downwardly from it, and the leads are in their normal working position before the microcircuit becomes encapsulated within the housing.

The foregoing and other objects and advantages of the invention will appear from the following description. In the description, reference is made to the accompanying drawings which form a part hereof, and in which there is shown by way of illustration and not of limitation a preferred embodiment of the invention. Such embodiment does not represent the full scope of the invention, but rather the invention may be employed in many different embodiments, and reference is made to the claims herein for interpreting the breadth of the invention.

BRIEF DESCRIPTION OF THE DRAWINGS

FIG. 3 is a plan view of the microcircuit package of FIG. 1 with the structural components assembled;

FIG. 4 is a longitudinal sectional view of the assembled microcircuit package after the injection of a potting compound into the package taken along the plane of the line 4—4 shown in FIG. 5;

FIG. 5 is a plan view of an end of the assembled microcircuit package of FIG. 3;

FIG. 6 is a transverse sectional view taken along the plane of the line 6—6 shown in FIG. 4; and FIG. 7 is a transverse sectional view taken along the plane of the line 7—7 shown in FIG. 3.

Figure 1:
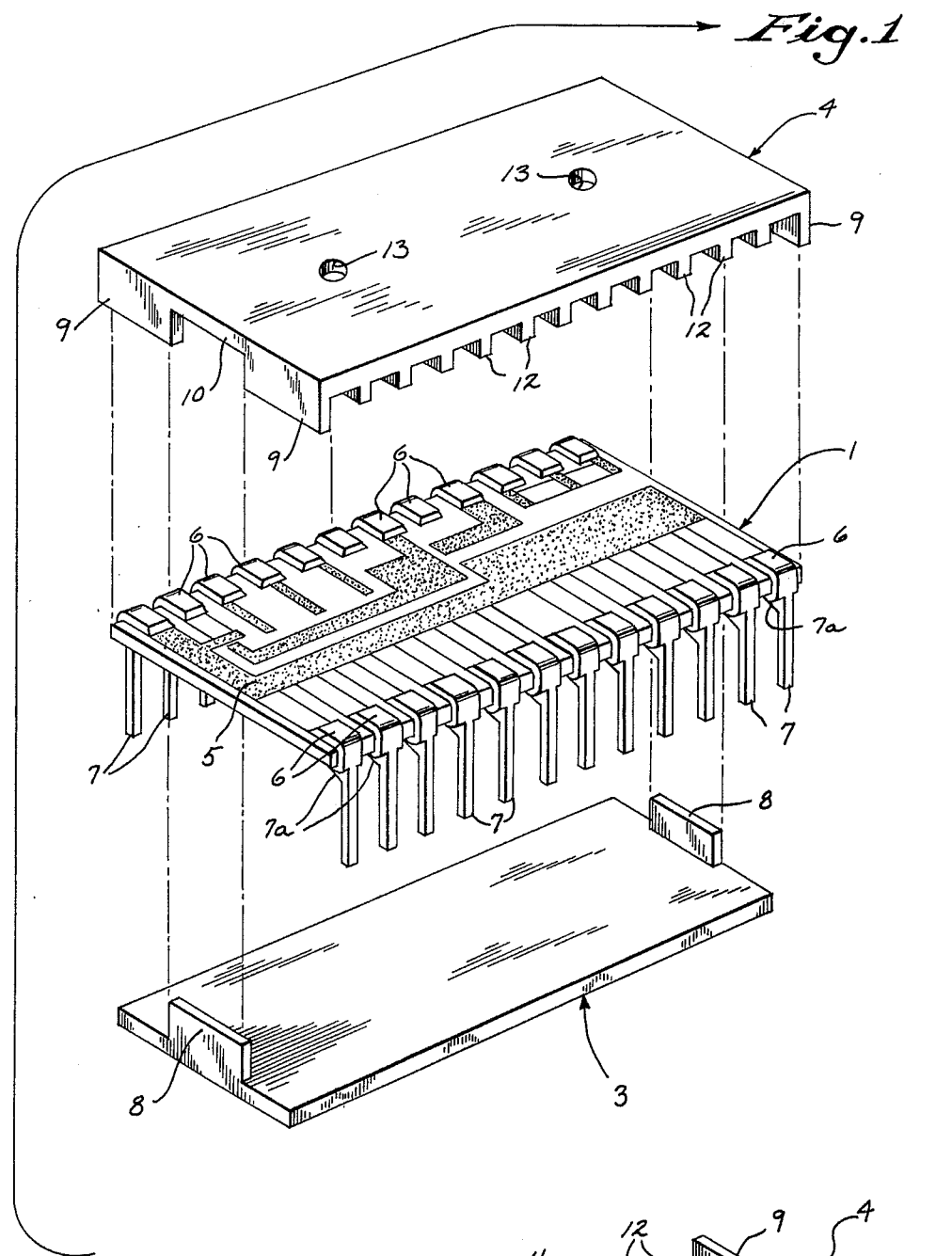
FIG. 1 is an exploded perspective view of the structural components of a microcircuit package which incorporates the present invention.

In the drawings, the various elements are not necessarily drawn to scale in order that all the elements described hereinafter can be shown.

DESCRIPTION OF THE PREFERRED EMBODIMENT

Figure 2:
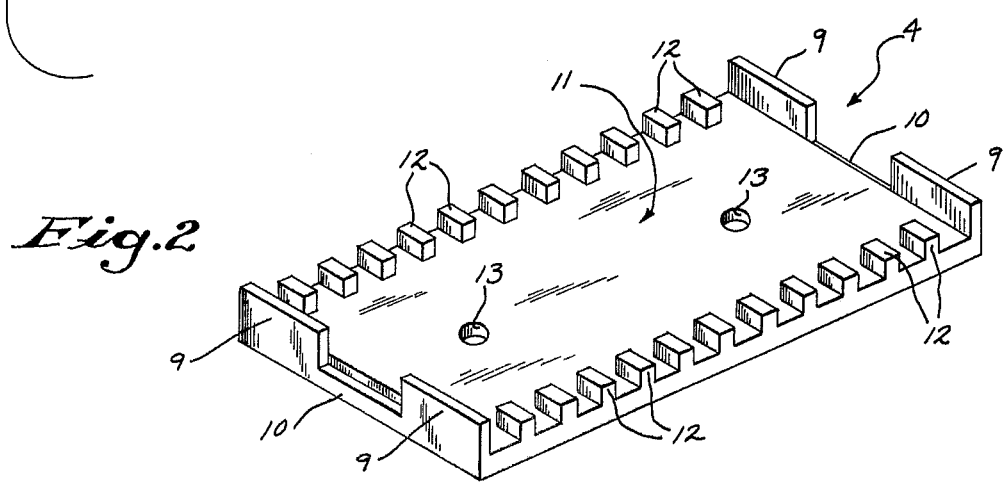
FIG. 2 is a perspective view of the underside of one of the structural components of the microcircuit package of FIG. 1.

Referring to FIGS. 1-3, the encapsulated microcircuit package shown includes three primary structural components. Specifically, a substrate 1 containing microcircuit elements is enclosed within a two-part housing generally indicated by the reference numeral 2 having a bottom cover portion 3 and a top cover portion 4. The microcircuit package illustrated is a dual-inline (DIP) package—a package in which a microcircuit is encapsulated that has two sets of leads, one of which is disposed on each longitudinal side of the package. Although a DIP package is illustrated in the preferred embodiment, it should be apparent from the description to follow that the invention also is applicable to a package containing a set of leads on only one longitudinal side, and to many other types of microcircuit packages.

With particular reference to FIG. 1, a microcircuit 5 which is to be encapsulated within the housing 2 is attached to the substrate 1. For example, the microcircuit 5, as shown in the drawings, may be a thin film resistor network consisting of integrated films of chromium cobalt vacuum deposited on an electrically inert glass substrate that is parallelepiped in shape. On the upper rectangular surface of the substrate 1, a plurality of terminals 6, as well as the microcircuit 5, are disposed. The terminals 6 are connected to the substrate 1 by metal film along the two longitudinal sides thereof, each terminal 6 having a metal lead 7 which is connected thereto also by metal film and projects outwardly and downwardly therefrom. Each lead 7 also is attached to the underside of the substrate 1 by a support member 7a thereby imparting increased mechanical strength to the leads 7. There are two sets of terminals 6—each set lying along one longitudinal side of the substrate 1—and the sets are in parallel relationship. It should be noted that none of the terminals 6 are in contact with any of the other terminals 6, and that the same is true with respect to the leads 7.

As previously mentioned, the microcircuit 5 is enclosed within a housing 2 which is composed of two parts, i.e., a bottom cover portion 3 and a top cover portion 4. Each cover portion is integrally molded of a plastic material—either a thermoset or a thermoplastic compound. Referring to FIGS. 1, 2, and 5 both cover portions are generally parallelepiped in shape having a pair of longitudinal sides spaced from one another and a pair of transverse ends extending between the longitudinal sides. The bottom cover portion 3 and the top cover portion 4 have the same longitudinal dimension, while the transverse distance between the longitudinal sides of the bottom cover portion 3 is slightly less than that for the top cover portion 4. The bottom cover portion 3 has a vertically projecting rectangularly shaped upstanding member 8 integrally molded on each end of its upper rectangular surface. A pair of walls 9 are integrally formed on each end of the top cover portion 4 and a narrow bridge 10 is formed on each end between each pair of walls 9. Thus, a rectangular recess is formed on each end between the walls 9 and above the bridge 10. Each recess is generally of the same size and shape as the upstanding members 8 and receives one of the upstanding members 8 when the package is assembled.

The structural features of the underside of the top cover portion 4 can be best discussed with reference to FIG. 2. A channel 11 resides between the ends of the top cover portion 4, and a plurality of partitions 12 are formed in the channel 11 and on the two longitudinal sides of the underside of the top cover portion 4. These partitions 12 serve to compartmentalize the channel 11, and when the bottom and top cover portions 3 and 4 are assembled about the substrate 1, each terminal 6 is disposed within one compartment of the channel 11. A pair of apertures 13 are formed in and extend through the top cover portion 4.

A package with the structural components in assembled relation is shown in FIG. 3. Referring to FIGS. 3-7, a preferred method of assembly includes initially securing the substrate 1 to the bottom cover portion 3. This can be suitably accomplished by applying a thin layer of adhesive 14 to the upper side of the bottom cover portion 3 and then placing the substrate 1 thereon so that its underside is in contact with the surface of the adhesive layer 14 which is opposite from the bottom cover portion 3. The substrate 1 then is enclosed within the housing 2 by coupling the bottom and top cover portions 3 and 4. The top cover portion 4 is brought into engagement with the bottom cover portion 3 so that the upstanding members 8 on the ends of the bottom cover portion 3 are mated with the recesses in the ends of the top cover portion 4. Thus, the two housing parts, which retain the substrate 1 therebetween, are brought together and are joined by mortise and tenon.

When the two housing parts are in assembled position, the underside of the top cover portion 4 faces the microcircuit located on the upperside of the substrate 1. Also, each transverse side of the substrate 1 abuts the walls 9 and the upstanding member 8 of one of the ends of the assembled package. Furthermore, the partitions 12 rest on the upperside of the substrate 1 between the terminals 6, so that each terminal 6 resides in one of the compartments with one lead 7 extending therefrom. The leads 7 depend from the terminals 6 extending alongside, but not contacting, the longitudinal sides of the bottom cover portion 3. The remainder of the area of the upperside of the substrate 1 lies within the channel 11, and does not, nor do the microcircuit components, contact the underside of the top cover portion 4.

The assembled housing 2 containing the substrate 1 and the layer of adhesive 14 is subsequently air cured. After the curing process is completed, a "potting" compound 15 is injected into the assembled housing 2 through the apertures 13 in the top cover portion 3. The potting compound 15 is a softened insulating material that is allowed to solidify. Upon solidification, the potting compound fills the voids and spaces between the bottom and top cover portions 3 and 4 and between the components of the microcircuit 5. Thus, the components are encapsulated for environmental protection—each component is insulated from the other components of the microcircuit as well as from other microcircuits. Since the potting compound flows between the leads 7, each lead 7 is insulated from the other leads 7. Each lead 7 is also insulated from the housing 2, and the compound 15 additionally serves to strengthen the connection between each lead 7 and its corresponding terminal 6.

It should be apparent to those skilled in the art that a number of variations can be made in the above described invention without departing from the spirit of the invention. For instance, the configuration and features of the housing parts could be modified. The upstanding members 8 could be molded on the top cover portion 4 and the walls 9 and bridge 10 formed on the bottom cover portion 3. Or, as another alternative, one upstanding member 8 could be formed on one end of the bottom cover portion 3 and one upstanding member 8 could be formed on one end of the top cover portion 4. Similarly, a pair of walls 9 and a bridge 10 could be formed on one end of the bottom cover portion 3 and on one end of the top cover portion 4. Also, the bottom and top cover portions 3 and 4 could be made of identical dimensions, with partitions 12 formed on each portion. In this manner, the two housing parts would be identical and the package could be assembled consistently with the principles of the invention. Thus, it would be necessary to mold only one type construction as a housing part rather than two types as shown in the preferred embodiment.

Many variations in the method of assembling the package also can be made. For example, although an adhesive 14 was employed in the preferred embodiment for securing the substrate 1 to the bottom cover portion 3 of the housing 2, other bonding media and techniques could be used. Also, the two housing parts could be fused by a number of techniques in addition to the mating action utilized in the preferred embodiment. An adhesive could be applied to the cover portions prior to coupling. Or, the cover portions could be placed together and ultrasonically welded, or soldered.

Different materials could be substituted for the three structural components 1, 3 and 4, and a variety of compounds could be used as an adhesive layer 14 and a potting compound 15. For example, the housing parts could be constructed of a ceramic or any other electrically insulating material, and the substrate 1 could be a ceramic material. Silicone or any compatible compound could be used for potting.

It also should be apparent to those skilled in the art that the principles of the invention can be used in encapsulating numerous types of microelectronic elements. Also, as previously mentioned, if a microcircuit is to be encapsulated, microcircuits other than DIPs can be accommodated by the teachings of the invention. Microcircuits having a single set of terminals 6 and leads 7 on one side of the substrate 1 can be encapsulated, as well as microcircuits not having leads 7.

We claim:
1. An encapsulated microcircuit, comprising:
   a housing having bottom and top cover portions, one of the cover portions having a projecting member thereon and the other cover portion having a recess therein which mates with the projecting member;
   a substrate having a microcircuit thereon, a plurality of terminals disposed on a side thereof, and an end abutting the projecting member and which is disposed between the bottom and top cover portions;
   means for bonding the substrate to the upper surface of the bottom cover portion; and
   a compound which is disposed between the top and bottom cover portions and encapsulates the microcircuit therebetween.

2. The encapsulated microcircuit of claim 1, wherein one of the cover portions of the housing has a plurality of compartments on a side thereof, each compartment having one of the terminals on the substrate disposed therein.

3. The encapsulated microcircuit of claim 1, wherein the substrate has a plurality of leads, each extending outwardly and downwardly from one of the terminals.

4. The encapsulated microcircuit of claim 1, wherein the bonding means comprises a layer of adhesive.

5. An encapsulated microcircuit, comprising:
   a housing having bottom and top cover portions, one of the cover portions having a projecting member on an end thereof and the other cover portion having a recess in an end thereof which mates with the projecting member;
   a layer of adhesive joined to the upper surface of the bottom cover portion;
   a substrate having a microcircuit thereon joined to the adhesive layer on the surface of the layer opposite from the bottom cover portion, a plurality of terminals disposed on a side thereof, and an end abutting the projecting member and which is disposed between the bottom and top cover portions; and
   a compound which is disposed between the bottom and top cover portions and encapsulates the microcircuit therebetween.

6. An encapsulated microcircuit, comprising:
   a housing having bottom and top cover portions, both cover portions having a pair of spaced longitudinal sides and a pair of transverse ends extending between the longitudinal sides, the bottom cover portion having a vertically rising upstanding member on one of its transverse ends and the top cover portion having a recess in one of its transverse ends which mates with the upstanding member of the bottom cover portion;

a layer of adhesive joined to the upper surface of the bottom cover portion;

a substrate having a microcircuit deposited therein joined to the adhesive layer, the substrate having a transverse end abutting the upstanding member, and including a plurality of terminals on a longitudinal side thereof, each terminal having a lead extending therefrom; and a potting compound disposed between the bottom and top cover portions and encapsulating the microcircuit therebetween.

7. An encapsulated microcircuit, comprising:

a housing having a bottom cover portion which engages a top cover portion, the top cover portion having a plurality of partitions thereon which define a plurality of compartments;

a substrate having a microcircuit thereon and a plurality of terminals disposed on a side thereof, each of the terminals residing in one of the compartments and between adjacent partitions which rest upon the substrate;

means for bonding the substrate to the upper surface of the bottom cover portion; and a potting compound disposed between the top and bottom cover portions and within the compartments and which encapsulates the microcircuit between the top and bottom cover portions and insulates the terminals from the partitions.

8. A method for encapsulating a microcircuit within a housing having bottom and top cover portions, comprising the steps of:

bonding a substrate having a microcircuit thereon to the bottom cover portion of the housing;

mating a projecting member on one of the cover portions of the housing in engagement with a recess in the other cover portion assembling the housing with the underside of the top cover portion facing the microcircuit on the substrate and an end of the substrate abutting the projecting member;

curing the assembled housing containing the substrate;

injecting a compound into the assembled housing so that it flows between the top and bottom cover portions; and allowing the compound to solidify whereby the microcircuit becomes encapsulated between the bottom and top cover portions.

9. The method of claim 8, wherein the bonding step comprises:

applying a layer of adhesive to the bottom cover portion of the housing; and placing the substrate on the adhesive layer on the surface of the layer opposite from the bottom cover portion.

10. The method of claim 8 including the step of applying a layer of adhesive to the projecting member of the one cover portion before it is placed into the recess in the other cover portion.

11. The method of claim 8, including the step of ultrasonically welding the top and bottom cover portions after the projecting member on the one cover portion is placed into the recess in the other cover portion.

12. A method of encapsulating a microcircuit within a housing having bottom and top cover portions, comprising the steps of:

applying a layer of adhesive to the bottom cover portion of the housing;

placing a substrate having a microcircuit on its upperside on the adhesive layer;

mating an upstanding member integrally formed on an end of the bottom cover portion into engagement with a recess formed in an end of the top cover portion assembling the housing with the underside of the top cover portion facing the microcircuit on the substrate and an end of the substrate abutting the upstanding member;

curing the assembled housing containing the substrate and the adhesive layer;

injecting a potting compound through an aperture formed in the top cover portion so that it flows between the bottom and top cover portions; and allowing the compound to solidify whereby the microcircuit becomes encapsulated between the bottom and top cover portions.

13. A method for encapsulating a microcircuit within a housing having bottom and top cover portions, the top cover portion having a plurality of partitions thereon which define a plurality of compartments, comprising the steps of:

bonding a substrate having a microcircuit and a plurality of terminals thereon to the bottom cover portion of the housing;

placing the top cover portion of the housing in engagement with the bottom cover portion with the partitions resting upon the substrate, thereby assembling the housing with each terminal disposed within one of the compartments between adjacent partitions;

curing the assembled housing containing the substrate;

injecting a compound into the assembled housing so that it flows between the top and bottom cover portions and into the compartments; and allowing the compound to solidify whereby the microcircuit becomes encapsulated between the bottom and top cover portions and the terminals become insulated from the partitions.

14. An encapsulated microcircuit, comprising:

a housing having bottom and top cover portions;

the bottom cover portion having a pair of projecting members which are on opposite ends thereof;

the top cover portion having a pair of recesses which are in opposite ends thereof and which mate with the projecting members of the bottom cover portion;

a substrate having a microcircuit thereon and a plurality of terminals disposed on a side thereof;

the substrate being disposed on the bottom cover portion between the projecting members and having opposite ends, each abutting one of the projecting members; and a compound disposed between the bottom and top cover portions and encapsulating the microcircuit therebetween.

15. A method for encapsulating a microcircuit within a housing having bottom and top cover portions, comprising the steps of:

bonding a substrate having a microcircuit thereon to the bottom cover portion of the housing;

mating a pair of projecting members on opposite ends of one of the cover portions with a pair of recesses in opposite ends of the other of the cover portions to assemble the housing, the substrate being positioned between the projecting members with the underside of the top cover portion facing the microcircuit on the substrate and having opposite ends, each abutting one of the projecting members;

curing the assembled housing containing the substrate;

injecting a compound into the assembled housing so that it flows between the top and bottom cover portions; and allowing the compound to solidify whereby the microcircuit becomes encapsulated between the bottom and top cover portions.

* * * * *